United States Patent [19]
Ishida

[11] Patent Number: 5,563,830
[45] Date of Patent: Oct. 8, 1996

[54] SEMICONDUCTOR MEMORY DEVICE WITH DATA BUS HAVING PLURALITY OF I/O PINS AND WITH CIRCUITRY HAVING LATCHING AND MULTIPLEXING FUNCTION

[75] Inventor: Ken Ishida, Tokyo, Japan

[73] Assignee: NEC Corporation, Tokyo, Japan

[21] Appl. No.: 532,881

[22] Filed: Sep. 22, 1995

[30] Foreign Application Priority Data

Sep. 22, 1994 [JP] Japan ................................. 6-227723

[51] Int. Cl.⁶ ................................................ G11C 7/00
[52] U.S. Cl. ............................. 365/189.02; 365/189.05; 365/201
[58] Field of Search ..................... 365/189.02, 189.03, 365/189.05, 230.08, 201

[56] References Cited

U.S. PATENT DOCUMENTS 5,383,157  1/1995  Phelan ...................................... 365/201
5,416,741  5/1995  Ohsawa ..................................... 365/201

*Primary Examiner*—David C. Nelms
*Assistant Examiner*—Vu A. Le
*Attorney, Agent, or Firm*—Sughrue, Mion, Zinn, Macpeak & Seas

[57] ABSTRACT

The semiconductor memory device disclosed includes a data bus, an I/O terminal, a distributing circuit, a multiplexer circuit, and a latching circuit. The data bus includes a plurality of I/O pins. The distributing circuit divides the data bus into a first data bus and a second data bus constituted by data bus signal lines, and controls a state of connections of the data bus signal lines such that the state is either a one-to-one connection state or a one-to-many connection state with respect to predetermined I/O pins. The multiplexer circuit divides the data bus between the distributing circuit and the memory cell array into the second data bus and a third data bus constituted by data bus signal lines, and controls a state of connections of the data bus signal lines such that the state is either a one-to-one connection state or a many-to-one connection state. The latching circuit latches signals outputted from the second data bus and inputs signals as control signals into the multiplexer circuit. The testing operations respectively for a plurality of I/O pins can be carried out without being limited by the number of drivers/comparators.

3 Claims, 6 Drawing Sheets

SEMICONDUCTOR MEMORY DEVICE WITH DATA BUS HAVING PLURALITY OF I/O PINS AND WITH CIRCUITRY HAVING LATCHING AND MULTIPLEXING FUNCTION

BACKGROUND OF THE INVENTION (1) Field of the Invention

The present invention relates to a semiconductor memory device, and more particularly to a semiconductor memory device which is provided with a data bus with an I/O terminals having a plurality of I/O pins for input and output purposes.

(2) Description of the Related Art

A semiconductor memory device of the kind to which the present invention relates comprises, as shown in FIG. 1, an I/O terminal 501 for input and output uses, a DATA-IN buffer 502, a DATA-OUT buffer 503, a distributing circuit 504, a coincidence circuit 505, data buses $506_1$, $506_2$, a decoder circuit 507, a sense amplifier circuit 508, and a memory cell array 509. The data bus $506_1$ is provided between the I/O terminal 501 and the distributing circuit 504, and the data bus $506_2$ is provided between the distributing circuit 504 and the decoder circuit 507.

When the data is written in the memory IC, the electric data signal of either "High" or "Low" is inputted to the I/O terminal 501 externally of the memory IC and, at the same time, an IN signal to the DATA-IN buffer 502 is made "Low". In this way, the DATA-IN buffer 502 is activated and the electric data signal is transferred to the data bus $506_1$. Also, by a select signal CA, the decoder circuit 507 is selected and the data is kept in the memory cell array 509 through the sense amplifier 508 of each memory. For outputting the data written in, the memory cell data is amplified by the sense amplifier 508, and the data signal line within the data bus $506_2$ and the memory cell within the memory cell array are selected by the decoder circuit 507.

For outputting the data, an OUT signal to the DATA-OUT buffer 503 is made "Low". Then, the DATA-OUT buffer 503 becomes activated, and the signal of the data bus $506_1$ is amplified and is outputted from the I/O terminal 501 to outside the memory IC.

For conducting the electrical testing of the memory IC, it is necessary to arrange that the I/O pins of the memory IC correspond to the driver/comparator pins of a testing means on a pin-to-pin basis, and a number of I/O pins of the memory IC are respectively connected to the driver/comparator pins of the same number in the testing means. Therefore, depending on the number of driver/comparator pins of the testing means, there will be a limit in the number of I/O pins, among a number of I/O pins in the memory IC, with which the measurement can be carried out simultaneously.

In the prior art memory device shown in FIG. 1, in order to increase the number of I/O pins with which the measurement can be made simultaneously, there are provided the distributing circuit 504 and the coincidence circuit 505.

The distributing circuit 504 shown in FIG. 2 is constituted by NMOS gates 601, 603 and 605 to which a TE signal to indicate a test mode of a gate is commonly applied, and NMOS gates 602, 604 and 606 to the gates of which an NO signal to indicate a normal state is commonly applied. The distributing circuit 504 controls a state of connections between data bus signal lines DB1–DB4 constituting a data bus $506_1$ and data bus signal lines DBA1–DBA4 constituting a data bus $506_2$.

The data bus signal line DB1 is connected to each of sources of the NMOS gates 601, 603 and 605, and is connected to the data bus signal line DBA1. The data bus signal lines DB2–DB4 are respectively connected to the sources of the NMOS gates 602, 604 and 606. The drains of the NMOS gates 601 and 602, gates 603 and 604, gates 605 and 606 are respectively connected with each other, thereby being connected to the data bus signal lines DBA2–DBA4.

In the distributing circuit 504 structured as above, when the TE signal which indicates a test mode status is made "Low" and the NO signal which indicates a normal state is made "High", the NMOS gates 602, 604 and 606 to which the NO signal is applied turn to a conductive state, and the NMOS gates 601, 603 and 605 to which the TE signal is applied turn to a non-conductive state. Consequently, the data bus signal lines DB1–DB4 are respectively connected to the data bus signal lines DBA1–DBA4 whereby the content of the data bus 5061 and that of the data bus $506_2$ will become the same.

When the NO signal is made "Low" and the TE signal is made "High", the NMOS gates 602, 604 and 606 to which the NO signal is applied turn to a non-conductive state, and the NMOS gates 601, 603 and 605 to which the TE signal is applied turn to a conductive state, whereby one data bus signal line DB1 is connected to a plurality of data bus signal lines DBA1–DBA4 and the data of four memory cells are stored simultaneously.

In the above prior art example, in the state in which one data bus signal line DB1 is connected to a plurality of data bus signal lines DBA1–DBA4, the electrical testing is carried out as to whether the memory operation is normal or not.

The electrical testing is carried out under the state in which the stored contents in each of the memory cells within the memory cell array 509 are made all either "High" or "Low". When the stored contents in each memory cell are outputted to the outside of the memory IC, the data stored in each memory cell are outputted to the data bus signal lines DBA1–DBA4 and inputted into the coincidence circuit 505. When the TE signal is "High", the coincidence circuit 505 operates, and determines whether all the stored contents in the memory cells are in coincidence with the levels preset. When in coincidence, "High" is outputted, and when not in coincidence, "Low" is outputted to the DATA-OUT buffer 503. At the DATA-OUT buffer 503, when the output of the coincidence circuit 505 is "High", the DBA1 data is amplified, and the amplified data is outputted to the outside of the memory IC from the I/O terminal 501. When such output is "Low", "High-z" (intermediate potential) is outputted from the I/O terminal 501. The operator of the device tests the output of the I/O terminal 501 thereby confirming any abnormality in the memory operation.

In the conventional memory IC explained above, it is so arranged that one data bus connected to the I/O terminal is connected to a plurality of data buses and that, in the case of the non-coincidence, the outputs of the plurality of data buses are outputted through one data bus. Thus, in the case where an output of a particular data bus is defective, it is not possible to confirm the reading and writing operation in the particular memory cells associated to the data bus, so that the entire data bus is judged defective.

SUMMARY OF THE INVENTION

An object of the present invention, therefore, is to overcome the problems existing in the prior art and to provide a semiconductor memory device in which testing operations respectively for a plurality of I/O pins (memory cells including data bus signal lines) can be carried out simultaneously without being limited by the number of drivers/comparators in the testing means.

According to one aspect of the invention, there is provided a semiconductor memory device comprising:

a data bus which transfers data stored in memory cells in a memory cell array;

an I/O terminal having a plurality of I/O pins with which data are written in and read from the memory cells through the data bus;

a distributing circuit which is disposed between the I/O terminals and the memory cell array such that the data bus is divided into a first data bus and a second data bus, the first data bus and the second data bus being constituted by a plurality of data bus signal lines, and which controls a state of connections of the data bus signal lines such that the state is one of a one-to-one connection state and a one-to-many connection state with respect to predetermined I/O pins;

a multiplexer circuit which is disposed in the second data bus between the distributing circuit and the memory cell array such that the second data bus is divided into the second data bus and a third data bus, the second data bus and the third data bus being constituted by a plurality of data bus signal lines, and which controls a state of connections of the data bus signal lines such that the state is one of a one-to-one connection state and a many-to-one connection state; and a latching circuit which, in order to maintain the connections of the data bus signal lines in the multiplexer circuit, latches signals outputted from the second data bus and inputs signals as control signals into the multiplexer circuit.

In the semiconductor memory device according to the invention, it is so arranged that, for the first and second data buses, one-to-one connection or one-to-many connections are made possible by a distributing circuit and, for the second and third data buses, one-to-one connection or many-to-one connections are made possible by a multiplexer circuit. During the normal testing, by causing the first and second data buses to be in the one-to-many connections and the second and third data buses to be in the many-to-one connections, the same testing as in the prior art explained above can be carried out. In this arrangement according to the invention, if defects are discovered, it is possible to cause the second and third data buses to be in the many-to-one connections and, under this state of connections, the defective memory cell can be identified.

In the device according to the invention, even when there exists a defect in a particular data bus of the memory IC having a number of I/O pins, it is possible to mask the defective data bus by switching data buses internally within the memory IC, and the testing operations can be carried out without being limited by the number of drivers/comparators of the testing means.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the drawings.

Figure 3:
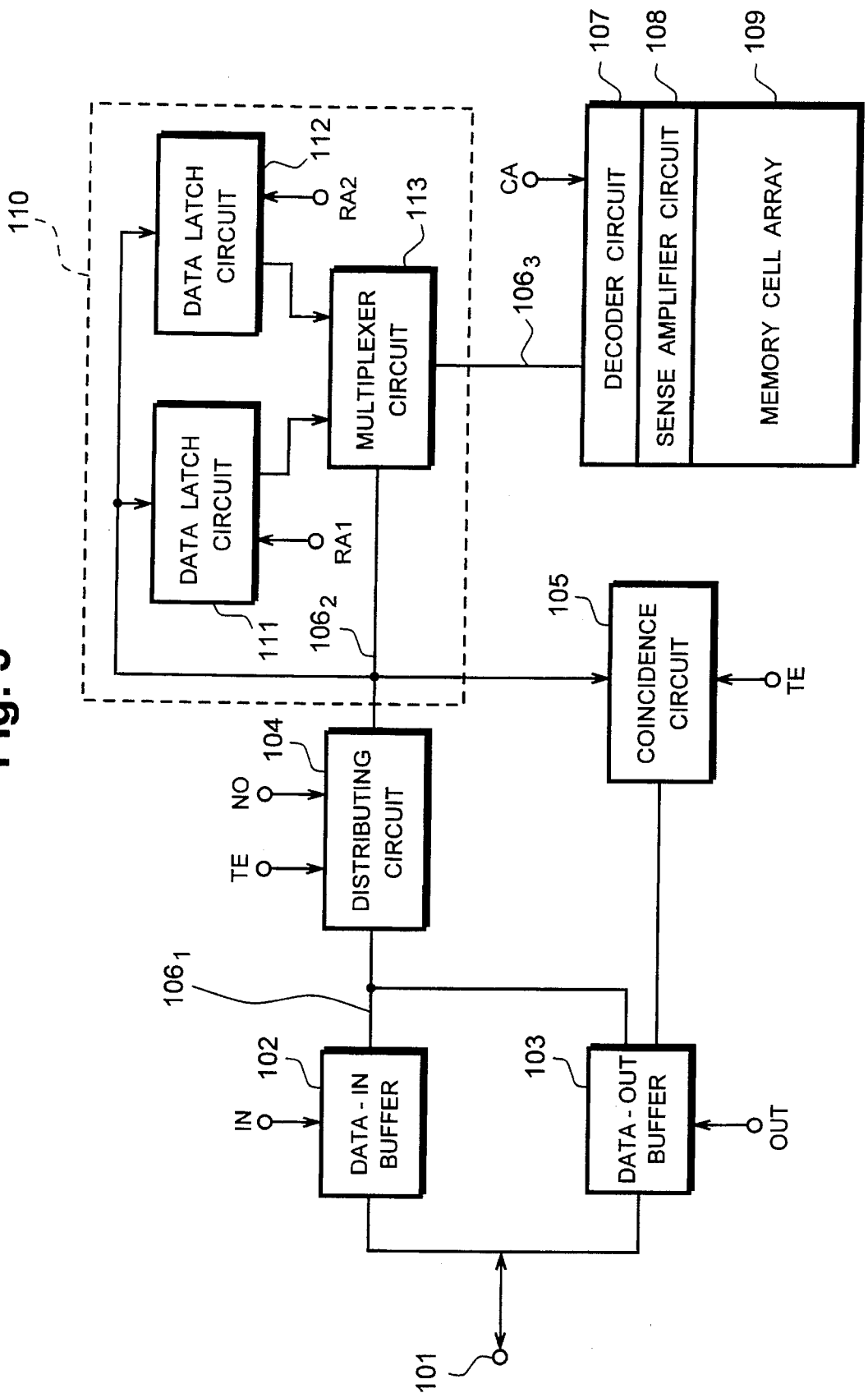
FIG. 3 is a block diagram showing a structural arrangement of a memory IC of a first embodiment according to the invention.

FIG. 3 shows, in a block diagram, a structure of a first embodiment according to the invention.

Figure 1:
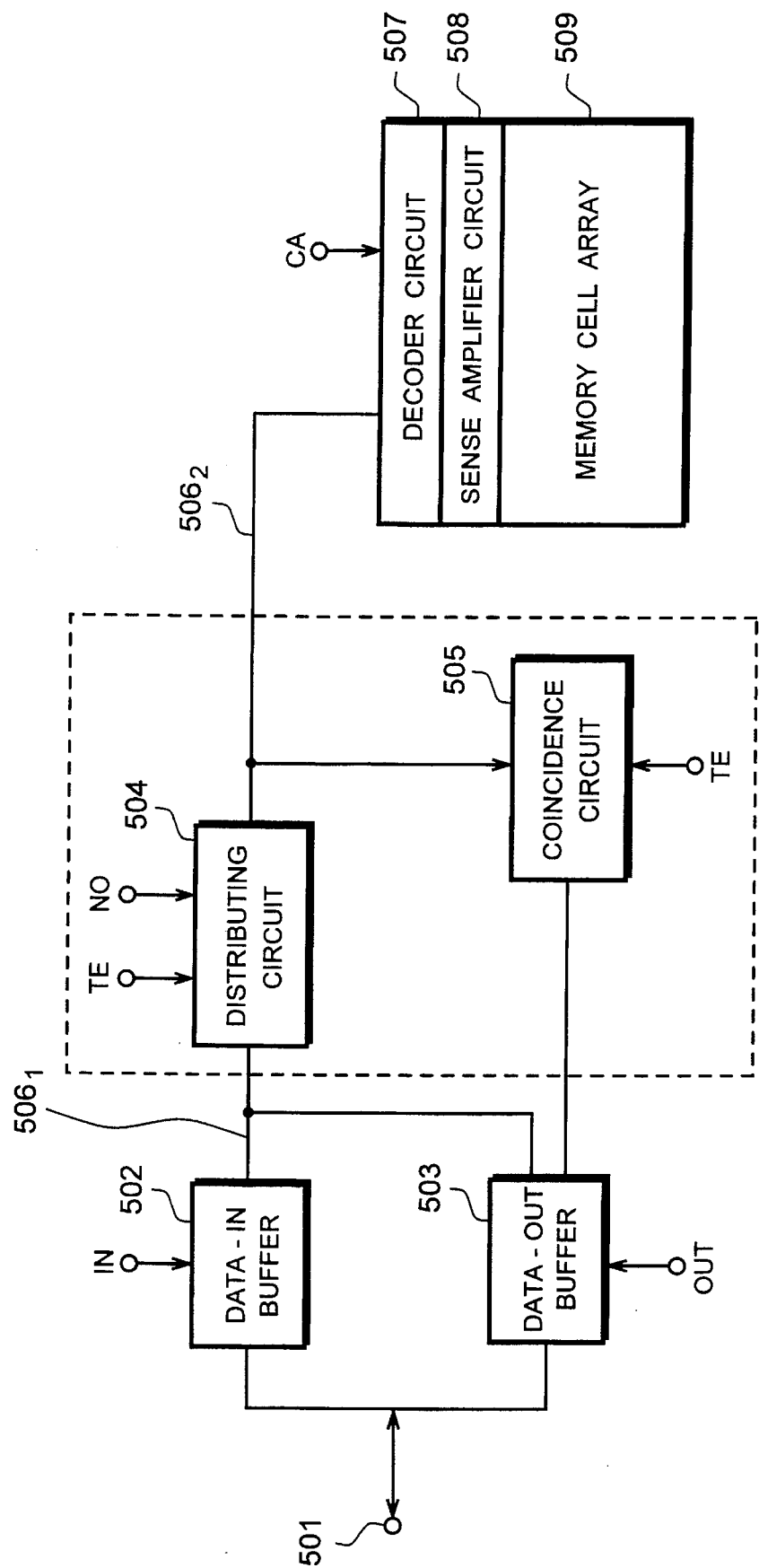
FIG. 1 is a block diagram showing a structural arrangement of a conventional memory IC.
Figure 2:
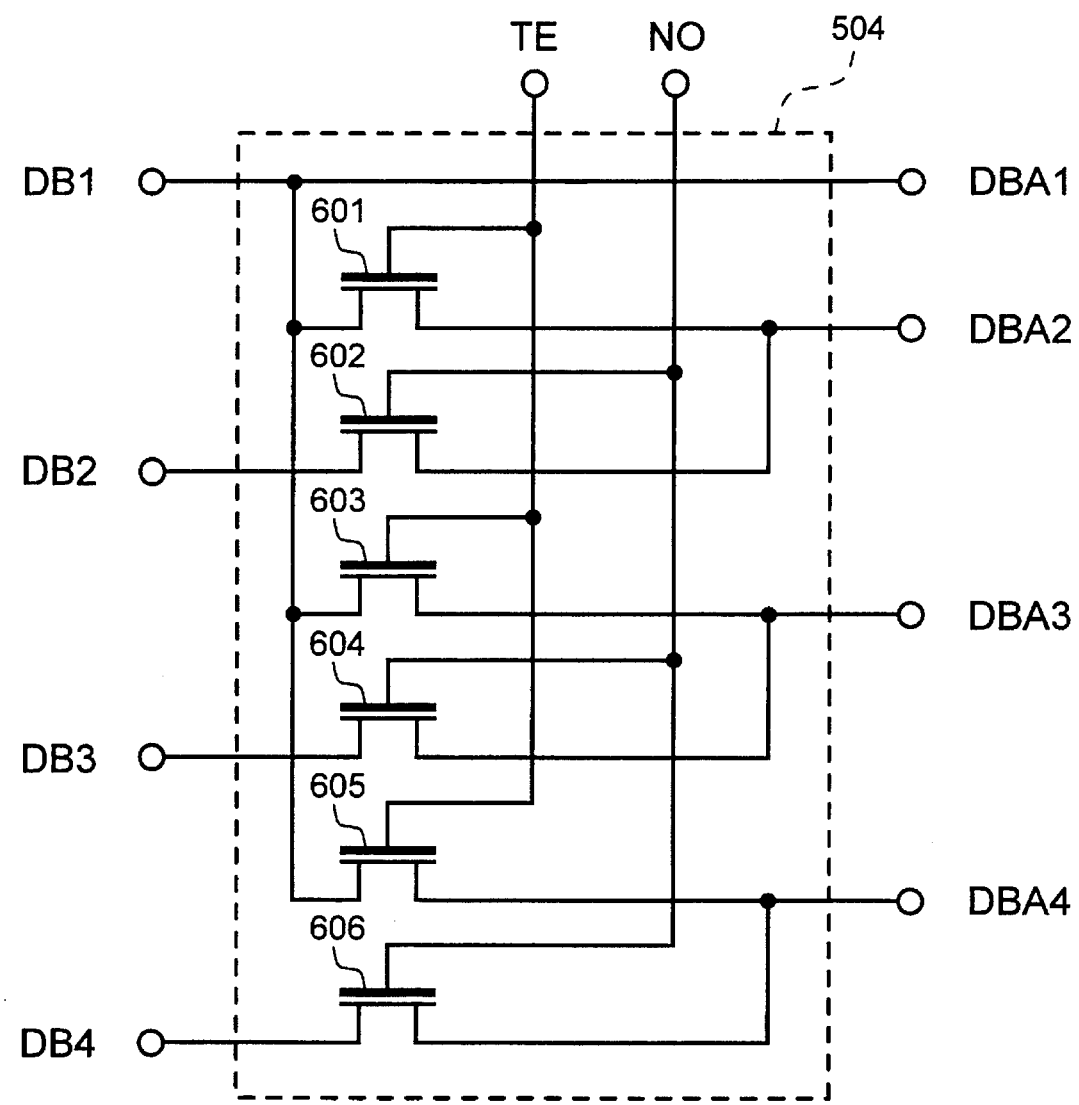
FIG. 2 is a circuit diagram showing a distributing circuit used in the conventional memory IC shown in FIG. 1.

The structure of this embodiment is one in which an additional circuit 110 is provided to the conventional memory circuit shown in FIG. 1. In FIG. 3, an I/O terminal 101, a DATA-IN buffer 102, a DATA-OUT buffer 103, a distributing circuit 104, a coincidence circuit 105, data buses $106_1$–$106_3$, a decoder circuit 107, a sense amplifier circuit 108, and a memory cell array 109 are respectively the same as the I/O terminal 501, the DATA-IN buffer 502, the DATA-OUT buffer 503, the distributing circuit 504, the coincidence circuit 505, the data buses 5061, 5062, the decoder circuit 507, the sense amplifier circuit 508, and the memory cell array 509 shown in FIG. 1. Thus, the explanations therefor are not repeated here.

The additional circuit 110 constituted by data latch circuits 111 and 112 and a multiplexer circuit 113 is disposed between the distributing/compressing circuit 104 and the decoder 107. Each of the data latch circuits 111 and 112 latches each data outputted to the data bus 1062 according to the output contents of the latch signals RA1 and RA2, and the latched contents, that is, MA1–MA4 and MB1–MB4, are outputted to the multiplexer circuit 113.

The data bus 1061 between the distributing/compressing circuit 104 and the I/O terminal 101 and the data bus 1062 between the distributing/compressing circuit 104 and the multiplexer circuit 113 are respectively constituted by the data bus signal lines DB1–DB4 and the data bus signal lines DBA1–DBA4, and the data bus 1063 between the multiplexer circuit 113 and the decoder 107 is constituted by the data bus signal lines DBB1–DBB4.

Figure 4:
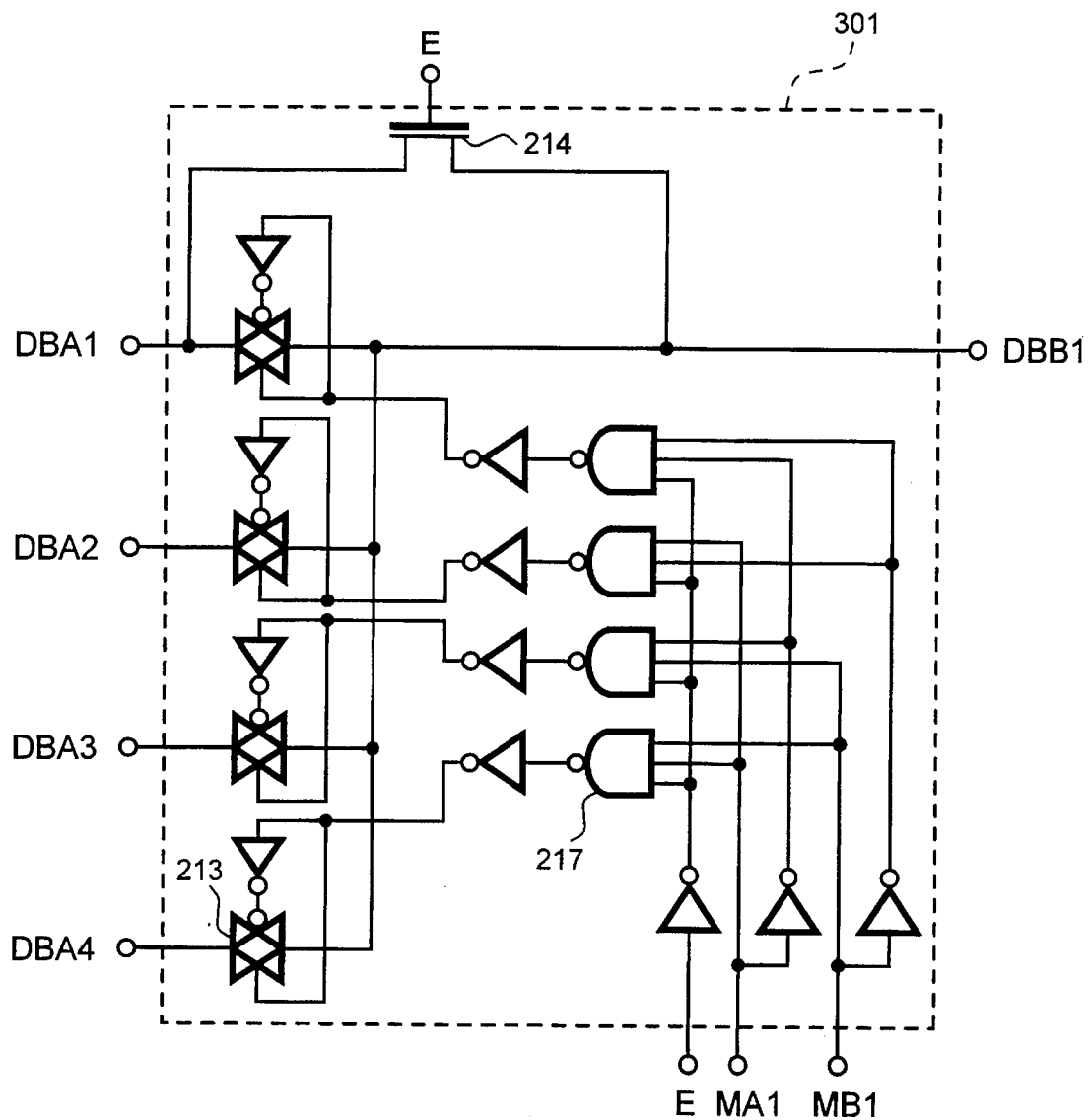
FIGS. 4 and 5 are diagrams showing multiplexers in the multiplexer circuit shown in FIG. 3.
Figure 5:
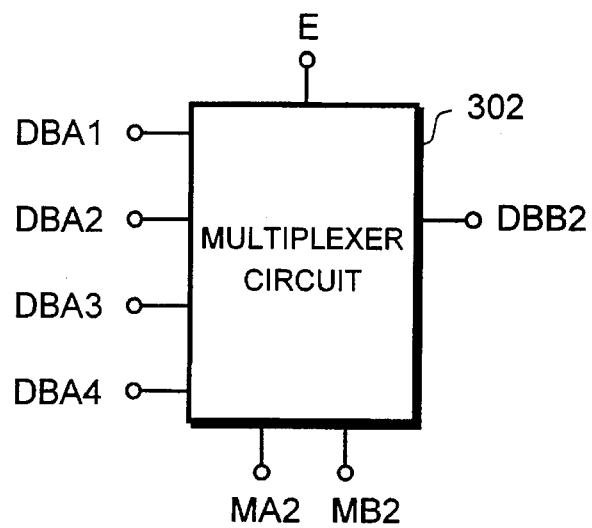
Figure 5:
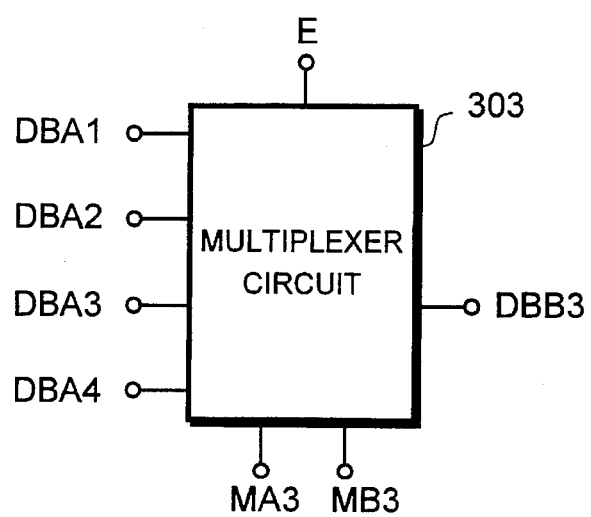
Figure 5:
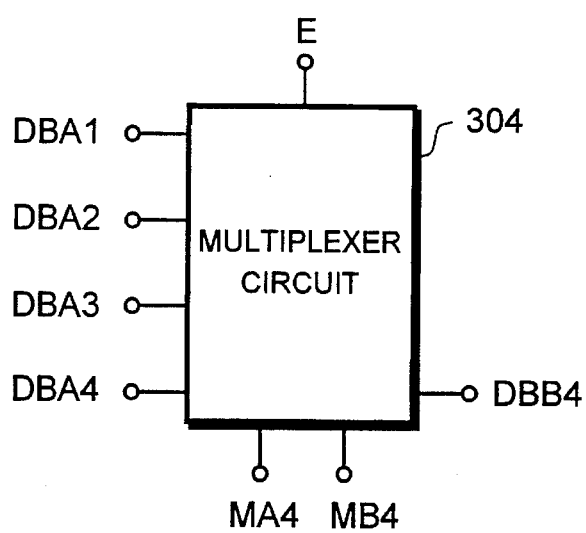

FIGS. 4 and 5 show, in diagrams, the multiplexer circuit 113. As shown therein, the multiplexer circuit 113 is constituted by a plurality of multiplexers 301–304, each of which is constituted by, as shown in FIG. 4, an NMOS gate 214, a plurality of gates 213, NAND gates 217 and buffer elements.

In the multiplexer circuit 113 arranged as above, the multiplexing operation takes place upon each latch output (MA1 and MB1 in an example of FIG. 4), and an output is made by making any of data bus signal lines DBA1–DBA4 as data bus signal lines DBB1–DBB4 (DBB1 in an example of FIG. 4 ).

Next, the performance of the device of this embodiment during the electrical testing operation is explained.

When the latch signal RA1 changes from "High" to "Low", signals of data bus signal lines DBA1–DBA4 which are connected to the data latch circuit 111 are taken into the latch circuit 111. The signals MA1–MA4, that is, the data bus contents at the time, are latched by the latch circuit 111 and outputted to the multiplexer circuit 113. Similarly, when the latch signal RA2 changes from "High" to "Low", the latch circuit 112 latches the data and outputs the signals MB1–MB4 to the multiplexer circuit.

In the multiplexer circuit 301 shown in FIG. 4, when an E signal at the initial state is "High", the NMOS gate 214 is a conductive state and the data bus signal lines DBA1 and DBB1 are connected with each other so that all of the gates 213 turn to non-conductive states. The multiplexer circuits 302, 303 and 304 shown in FIG. 5 respectively cause the DBA2 to be connected to the DBB2, the DBA3 to DBB3, and DBA4 to DBB4.

When the E signal is "Low", the NMOS gate 214 turns to a non-conductive state, and the NAND gate 217 turns to an activated state. In the multiplexer circuit 301, when the MA1 is "Low" and the MB1 is "Low", the gate 213 connected to the DBA1 turns to a conductive state. The other gates become non-conductive, and the DBA1 is connected to the DBB1. Similarly, in the multiplexer circuits 302–304, too, when the MA2–MA4 are "Low" and the MB2–MB4 are "Low", the DBA2–DBA4 are connected respectively to the DBB2–DBB4. As a result, for example, the data bus line DB1 is distributed by the distributing/compressing circuit 104 into the DBA1–DBA4, which are again connected to the DBB1 by the multiplexer circuit 301.

In the embodiment wherein the connections can be made in the manner explained above, the testing is conducted using simple test patterns, and the confirmation is made as to the reading and writing operations of the decoder 107, the sense amplifier 108 and the memory cell array 109 which are connected to the DBB1. Next, the MA1–MA4 and MB1–MB4 signals are varied and, by the multiplexer circuit 113, the DBB2–DBB4 are caused to be sequentially connected to the DBA1. Thus, the repetition of the same testing enables the detection of defective cells by detecting to which data bus such a cell is connected.

Now, it is assumed that the DBB2 is a defective line, the DBA1 is connected to the DBB1, the DBA3 to the DBB3, and the DBA4 to the DBB4. The DBA2 is switched to the DBB1. As a result, the defective data bus signal line DBB2 can be separated from the lines being tested so that, by using one I/O terminal, all the I/O pins can be tested.

Figure 6:
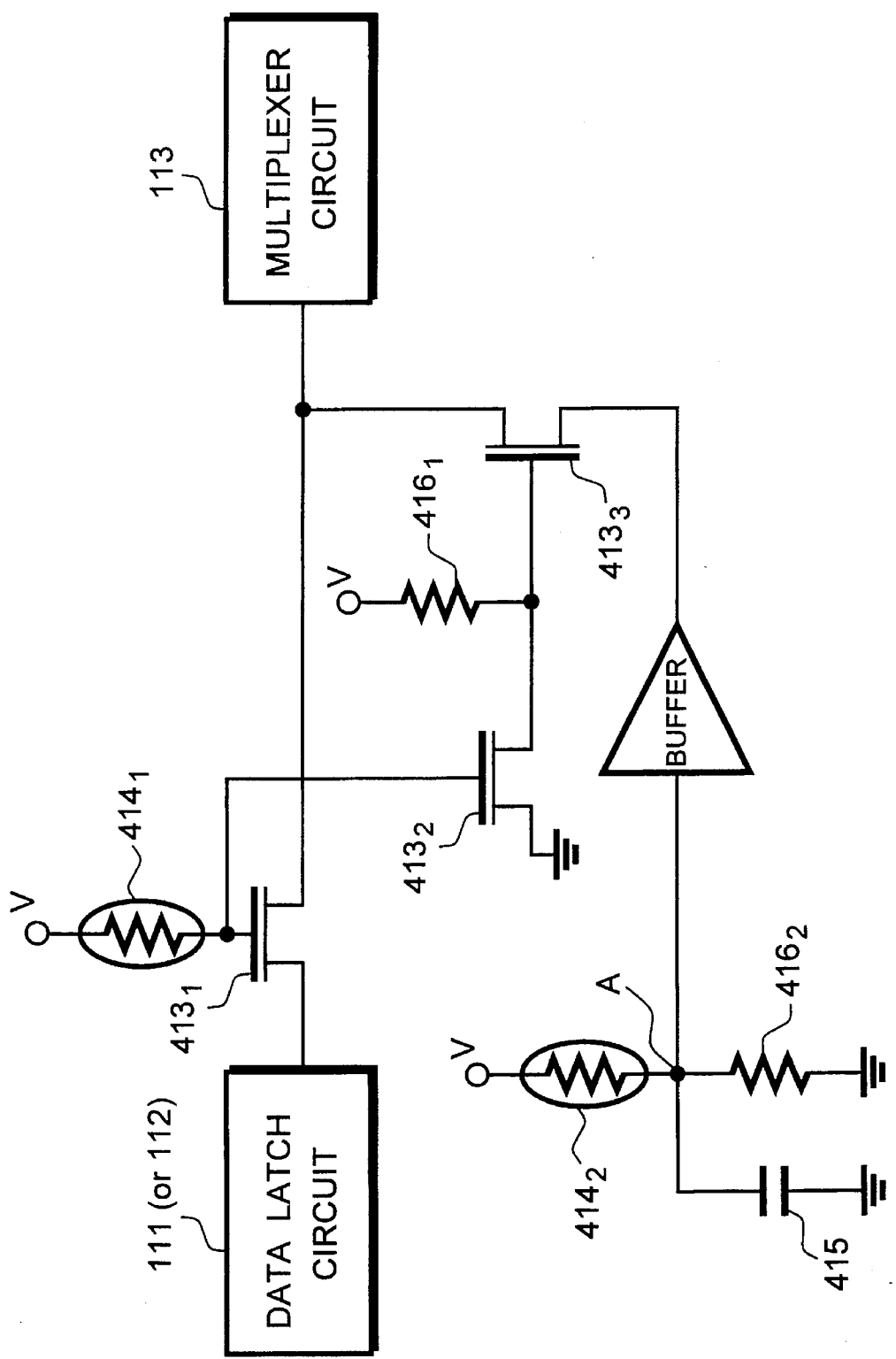
FIG. 6 is a circuit diagram showing a circuitry arrangement of a second embodiment according to the invention.

FIG. 6 shows, in a circuit diagram, an essential circuitry arrangement of the second embodiment according to the invention. In this embodiment, a data fixing circuit for separating a defective I/O terminal is provided at an output portion of the data latch circuit 111 (and 112) in the first embodiment explained above. Other arrangements are the same as those in the first embodiment, so that FIG. 6 shows only the data fixing circuit.

The data fixing circuit in this embodiment is constituted by NMOS gates $413_1$–$413_3$, resistors $414_1$, $414_2$, $416_1$ and $416_2$, and a capacitor 415.

The data latch circuit 111 and the multiplexer circuit 113 are connected with each other through the NMOS gate $413_1$. The gates of the NMOS gates $413_1$ and $413_2$ are connected commonly to a power source through a polysilicon resistor $414_1$. The source of the NMOS gate $413_2$ is grounded, and the drain thereof and the gate of the NMOS gate $413_3$ are commonly connected to the power source through a resistor $416_1$. The drain of the NMOS gate $413_3$ is connected to the multiplexer circuit 113, and the source is connected to a node A through a buffer. The node A is connected to the power source through the polysilicon resistor $414_2$, and is grounded through the capacitor 415 and the resistor $416_2$ which are provided in parallel to each other.

In the data fixing circuit of this embodiment explained above, in order to separate defective I/0s permanently from the outside, the resistors $414_1$ and $414_2$ are cut by the irradiation of laser beams during the wafer testing. In this way, the NMOS gate $413_1$ becomes non-conductive and the NMOS gate $413_3$ becomes conductive. When the resistor $414_2$ is cut under this state, the node A is grounded and the output MA of the latch circuit 111 is fixed to "Low". If the resistor $414_2$ is not cut, since the resistor $416_2$ is one having a sufficiently large resistance value as compared with that of the resistor $414_2$, the node A is of a power source potential, and the output MA of the latch circuit 111 is fixed to "High".

Where the data fixing circuit having the above configuration is provided to each of the outputs of the data latch circuit, it is possible for the MA1–MA4 and MB1–MB4 to switch and fix the data buses as desired.

While the invention has been described in its preferred embodiments, it is to be understood that the words which have been used are words of description rather than limitation and that changes within the purview of the appended claims may be made without departing from the scope of the invention as defined by the claims.

What is claimed is:

1. A semiconductor memory device comprising:

a data bus which transfers data stored in memory cells in a memory cell array;

an I/O terminal having a plurality of I/O pins with which data are written in and read from said memory cells through said data bus;

a distributing circuit which is disposed between said I/O terminals and said memory cell array such that said data bus is divided into a first data bus and a second data bus, said first data bus and said second data bus being constituted by a plurality of data bus signal lines, and which controls a state of connections of said data bus signal lines such that the state is one of a one-to-one connection state and a one-to-many connection state with respect to predetermined I/O pins;

a multiplexer circuit which is disposed in said second data bus between said distributing circuit and said memory cell array such that said second data bus is divided into the second data bus and a third data bus, said second data bus and said third data bus being constituted by a plurality of data bus signal lines, and which controls a state of connections of said data bus signal lines such that the state is one of a one-to-one connection state and a many-to-one connection state; and a latching circuit which, in order to maintain the connections of said data bus signal lines in said multiplexer circuit, latches signals outputted from said second data bus and inputs signals as control signals into said multiplexer circuit.

2. The semiconductor memory device according to claim 1, further comprising a data fixing circuit which is disposed between said multiplexer circuit and said latching circuit, and which permanently fixes the control signal inputted into said multiplexer circuit and maintains the connections of said data bus signal lines in the multiplexer circuit.

3. The semiconductor memory device according to claim 2, wherein said data fixing circuit includes resistors which are formed of polysilicon adapted to be cut by irradiation of laser beams.

* * * * *

UNITED STATES PATENT AND TRADEMARK OFFICE
CERTIFICATE OF CORRECTION

PATENT NO.    : 5,563,830
DATED         : October 8, 1996
INVENTOR(S)   : Ken ISHIDA It is certified that error(s) appears in the above-identified patent and that said Letters Patent is hereby corrected as shown below:

Column 2, line 19, delete "5061" and insert --$506_1$--.

Column 4, line 30, delete "5061, 5062" and insert --$506_1$, $506_2$--.

Column 4, line 38, delete "1062" and insert --$106_2$--.

Column 4, line 42, delete "1061" and insert --$106_1$--;

Column 4, line 43, delete "1062" and insert --$106_2$--.

Column 4, line 47, delete "1063" and insert --$106_3$--.

Signed and Sealed this

Twenty-second Day of April, 1997

Attest:

BRUCE LEHMAN

Attesting Officer

Commissioner of Patents and Trademarks